United States Patent [19]

Hiraoka

[11] Patent Number: 4,507,331

[45] Date of Patent: Mar. 26, 1985

[54] DRY PROCESS FOR FORMING POSITIVE TONE MICRO PATTERNS

[75] Inventor: Hiroyuki Hiraoka, Saratoga, Calif.

[73] Assignee: International Business Machines Corporation, Armonk, N.Y.

[21] Appl. No.: 560,638

[22] Filed: Dec. 12, 1983

[51] Int. Cl.$^3$ .............................................. B05D 3/06
[52] U.S. Cl. ...................................... 427/38; 156/643; 156/646; 427/43.1; 430/310
[58] Field of Search ................ 427/43.1, 38; 430/297, 430/310, 317, 326; 156/643, 646

[56] References Cited

U.S. PATENT DOCUMENTS

| | | | |
|---|---|---|---|
| 4,004,044 | 1/1977 | Franco et al. ........................... | 427/43 |
| 4,332,879 | 6/1982 | Pastor et al. ........................... | 427/43.1 |
| 4,357,369 | 11/1982 | Kilichowski et al. ............... | 427/43.1 |
| 4,396,702 | 8/1983 | Desai et al. ............................ | 430/326 |
| 4,396,704 | 8/1983 | Taylor ................................ | 427/43.1 |
| 4,405,710 | 9/1983 | Balasubramanyam et al. ..... | 430/326 |
| 4,414,059 | 11/1983 | Blum et al. ........................... | 427/43.1 |
| 4,417,748 | 11/1983 | Mayne-Banton et al. ......... | 427/53.1 |

FOREIGN PATENT DOCUMENTS 55-138835 10/1980 Japan .

OTHER PUBLICATIONS

IBM Technical Disclosure Bulletin, vol. 20, No. 6, Nov. 1977, p. 2208, "Masking Material for the Reactive Ion Etching of Metals", by Feng et al.

*Primary Examiner*—John H. Newsome
*Attorney, Agent, or Firm*—Joseph G. Walsh

[57] ABSTRACT

A dry process for forming a positive tone micro pattern by coating a substrate with an organic polymer film then with a film of an oxygen etch barrier, selected from the group consisting of films of organometallic, including organosilicon compounds and metals, exposing the etch barrier film to a low energy proton beam in a patternwise manner, and developing the pattern by means of oxygen reactive ion etching.

7 Claims, No Drawings

DRY PROCESS FOR FORMING POSITIVE TONE MICRO PATTERNS

DESCRIPTION

1. Technical Field

The present invention is concerned with a totally dry process for forming positive tone micro patterns. The process involves the use of proton beam exposure through a mask and development by means of oxygen reactive ion etching.

2. Background Art

My prior application Ser. No. 06/529,458, filed Sept. 30, 1983 and assigned to the same assignee as the present application, shows a process involving the use of a beam of protons and oxygen plasma development. That process, however, involves the formation of negative tone images, while the present application is concerned with positive tone images.

U.S. Pat. No. 4,004,044 shows a method for forming patterned films utilizing a transparent lift-off mask. Etching is done with a gas containing $CF_4$. No proton beam is involved in that patent.

IBM Technical Disclosure Bulletin Vol. 20 No. 6 November 1977, page 2208, shows the use of an organo-silicate glass as a masking material. A polysulfone layer is also used. No proton beam is involved in the publication.

Japanese patent application No. 55-138835 shows a multi-layer resist using two different resists, with the second resist pattern acting as a mask for the first. The process does not involve any use of a proton beam.

DISCLOSURE OF THE INVENTION

The present invention provides a totally dry process for forming positive tone micro patterns having high resolution and high aspect ratio. The process comprises first depositing an organic polymer film on a substrate. The substrate is usually silicon or silicon dioxide. An oxygen etch barrier film is then deposited on said organic polymer film. The barrier film is then patternwise exposed to a low energy proton beam. Finally, the pattern is developed by means of oxygen reactive ion etching.

The present invention is of use, for example, in the fabrication of micro circuits. It has the particular advantage of providing positive tone patterns in a process which is completely dry. All the disadvantages of wet processes are therefore eliminated.

Although for most purposes the substrate will be silicon or silicon dioxide, there is no reason why the process could not be applied to other substrates when so desired. The organic polymer film closest to the substrate may be any kind of polymer. Useful polymers include, for example, poly(methyl methacrylate), novolac resins, polyimides, poly(olefin sulfones) and poly(phenylsulfone).

The oxygen etch barrier film may be made from an organo-metallic compound or from a metal. The useful organo-metallic compound includes an organo-silicon compound like tetravinylsilane, hexamethyldisiloxane, hexamethyldisilazane, monovinyltrimethylsilane, or an organo-tin compound like tetramethyltin. The useful metals include bismuth, aluminum, silver, nickel and tin. For best results, the oxygen etch barrier film should be between about 150 and 250 angstroms thick. To avoid pinholes in this layer, the barrier layer should be deposited from the vapor state. This may be carried out by means of evaporation or sputtering to deposit a metal-containing layer or by means of plasma polymerization, either direct or downstream. When the barrier film is made of a thin metal film, it has the advantage of avoiding problems associated with charge buildup which may cause the doughnut shaped image problem. Very high resolution and very high aspect ratio with thick films exceeding 5 um are thereby achieved. The metal is removed efficiently as volatile metal hydride, such as $AlH_3$, $BiH_3$, $SiH_4$, $SnH_4$, under proton exposures.

The oxygen etch barrier film is patternwise exposed to a low energy proton beam. This exposure can take place with the pattern being imposed by the use of a mask. Alternatively, it can also take place using a scanning focused beam.

The final step is the developing of the pattern by means of oxygen reactive ion etching. Because the process is completely dry, the problems of adhesion, abrasion, cracking and the like which occur in wet processes are completely avoided.

The following Examples are given solely for the purpose of illustration and are not to be considered limitations on the invention, many variations of which are possible without departing from the spirit or scope thereof.

EXAMPLE I

A film of poly(methyl methacrylate) (PMMA) 3 μm thick was coated as a base polymer film on a silicon substrate. Very thin polymeric films of tetravinylsilane were deposited on top of the PMMA in downstream argon plasma polymerization as an oxygen etch barrier layer. The deposition period was 30 seconds under a total pressure of 250 micron. The excess amounts of the etch barrier do not yield fully developed polymer images later on. The etch barrier thickness should be kept at a minimum, on the order of 150 angstroms or so. The etch barrier can be any kind of oxygen etch barrier, but it should be removable by $H^+$ beams. With polysilane films, silicon should be removed in the form of $SiH_2$ and/or $SiH_4$.

Following the oxygen etch barrier deposition, $H^+$ beam exposure (4 KeV, 100 μA, $3 \times 10^{-5}$ torr) was carried out using a mask of Si having holes of 16 μm in diameter. The dose level was roughly in the order of $10^{-4}$ C/cm$^2$. After the $H^+$ beam exposure, the mask was removed and polymer images were developed in an oxygen reactive ion etching here, (−200 V bias potential, 0.12 torr, 7.6 sccm, 45 minutes for total etching period with 100 W power level).

EXAMPLE II

In another example of submicron positive tone polymer pattern fabrications, a shadow printing mask was used. However, the present subtractive ion beam technology is equally suited to scanning ion beams with focused $H^+$ beams. The exact same procedures as described in Example I were followed.

Very good results were obtained with a photoresist made of poly(p-hydroxystyrene) and an aromatic azide photosensitizer. The films were spin-coated onto a silicon wafer, and baked at 100° C.; the thickness was about 2 μm. On top of this photoresist film, polymeric tetravinylsilane films were deposited in downstream Ar plasma polymerization for 30 seconds at 0.25 torr pressure. Following the etch barrier deposition, $H^+$ beam exposure was carried out with a mask at 4 keV, 100 μA beam condition. After the H+ beam exposure, the oxygen RIE image development was carried out for 38 minutes at 0.12 torr, −250 V bias potential, 100 W power level and 7.6 sccm. The scanning electron microscopy (SEM) picture of the developed polymer patterns demonstrated the capability of the present technology for delineating submicron positive patterns with almost vertical wall profiles.

EXAMPLE III

Very good results were obtained with vapordeposited polyimide films. Vapor deposited polyamic acid films were cured at 250° C. for 30 minutes in air. The deposition of the oxygen etch barrier and H+ beam exposure were carried out in the exact same way as described in Example I. The polymer image development in the oxygen RIE took only 25 minutes with the polyimide films. SEM pictures clearly demonstrate the capability of the present subtractive ion beam lithographic technology for delineating submicron patterns of polyimides in positive tone.

EXAMPLE IV

With very thin bismuth film deposited by evaporation on top of PMMA, high aspect ratio and high resolution polymer patterns with 0.5 μm width and 5 μm height were obtained in a similar way to that described in Example III. The bismuth oxide formed on top of PMMA patterns was removed readily in treatment with aqueous hydrogen chloride solution.

I claim:
1. A dry process for forming a positive tone micro pattern with high resolution and high aspect ratio, said process comprising the steps of:
   (1) depositing an organic polymer film on a substrate;
   (2) depositing an oxygen etch barrier film on said organic polymer film said oxygen etch barrier film consisting of an organometallic, including ogranosilicon compound or a metal;
   (3) patternwise exposing said barrier film to a low energy proton beam,
and
   (4) developing the pattern by means of oxygen reactive ion etching.
2. A process as claimed in claim 1 wherein the barrier film is deposited from the vapor state.
3. A process as claimed in claim 1 wherein the barrier film is from 150 to 250 angstroms thick.
4. A process as claimed in claim 1 wherein the barrier film comprises an organo metallic compound.
5. A process as claimed in claim 1 wherein the barrier film comprises a silicon-containing compound.
6. A process as claimed in claim 1 wherein the barrier film is poly(tetravinylsilane).
7. A process as claimed in claim 1 wherein the barrier film is a volatile hydride-forming metal.

* * * * *